(12) United States Patent
Kobayashi et al.

(10) Patent No.: US 9,679,800 B2
(45) Date of Patent: Jun. 13, 2017

(54) METHOD FOR MANUFACTURING BONDED WAFER

(71) Applicant: SHIN-ETSU HANDOTAI CO., LTD., Tokyo (JP)

(72) Inventors: Norihiro Kobayashi, Takasaki (JP); Hiroji Aga, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 43 days.

(21) Appl. No.: 14/912,679

(22) PCT Filed: Aug. 1, 2014

(86) PCT No.: PCT/JP2014/004038
§ 371 (c)(1),
(2) Date: Feb. 18, 2016

(87) PCT Pub. No.: WO2015/033516
PCT Pub. Date: Mar. 12, 2015

(65) Prior Publication Data
US 2016/0204024 A1    Jul. 14, 2016

(30) Foreign Application Priority Data

Sep. 5, 2013  (JP) ................................ 2013-184209

(51) Int. Cl.
*H01L 21/46* (2006.01)
*H01L 21/762* (2006.01)

(52) U.S. Cl.
CPC .............................. *H01L 21/76254* (2013.01)

(58) Field of Classification Search
CPC ............................................... H01L 21/76254
See application file for complete search history.

(56) References Cited

U.S. PATENT DOCUMENTS 5,374,564 A    12/1994  Bruel
6,596,610 B1   7/2003   Kuwabara et al.
(Continued)

FOREIGN PATENT DOCUMENTS

JP    H05-211128 A    8/1993
JP    2001-155978 A   6/2001
(Continued)

OTHER PUBLICATIONS

Mar. 8, 2016 International Preliminary Report on Patentability issued in International Patent Application No. PCT/JP2014/004038.
(Continued)

*Primary Examiner* — Bradley K Smith
(74) *Attorney, Agent, or Firm* — Oliff PLC

(57) ABSTRACT

Method for manufacturing a bonded wafer, including implanting at least one gas ion into a bond wafer from a bond wafer surface forming an ion implantation layer, bonding the surface from the ion implantation into bond wafer and base wafer surface, and delaminating the bond wafer part along the ion implantation layer by heat treatment forming a bonded wafer having thin-film on the base wafer, wherein heat treatment is at most 400° C. to delaminate bond wafer part along the ion implantation layer, including measuring bond wafer thicknesses and base wafer, selecting a combination of bond and base wafers so difference between both wafers thicknesses is 5 μm or more before bonding the bond and base wafers. Inhibition of film thickness unevenness with marble pattern caused in thin-film when a bonded wafer is manufactured by ion implantation delamination method, and can manufacture a bonded wafer having thin-film with high thickness uniformity.

10 Claims, 2 Drawing Sheets

(56) References Cited

U.S. PATENT DOCUMENTS

| | | | |
|---|---|---|---|
| 2003/0216008 A1 | 11/2003 | Schwarzenbach et al. | |
| 2008/0124929 A1 | 5/2008 | Okuda et al. | |
| 2009/0209085 A1 | 8/2009 | Tamura et al. | |
| 2011/0049528 A1 | 3/2011 | Dupont | |
| 2014/0273400 A1 | 9/2014 | Ishizuka et al. | |
| 2016/0118294 A1* | 4/2016 | Kobayashi | H01L 21/76254 |
| | | | 438/14 |

FOREIGN PATENT DOCUMENTS

| | | | |
|---|---|---|---|
| JP | 2003-347526 A | 12/2003 | |
| JP | 2006-140445 A | 6/2006 | |
| JP | 2007-149907 A | 6/2007 | |
| JP | 2008-021892 A | 1/2008 | |
| JP | 2013-089720 A | 5/2013 | |
| WO | 2009/141954 A1 | 11/2009 | |

OTHER PUBLICATIONS

Aug. 9, 2016 Notification of Reasons for Refusal issued in Japanese Application No. 2013-184209.
Nov. 11, 2014 International Search Report issued in International Patent Applicatiion No. PCT/JP2014/004038.
Sep. 7, 2016 Office Action issued in Taiwanese Application No. 103127300.

* cited by examiner

METHOD FOR MANUFACTURING BONDED WAFER

BACKGROUND OF THE INVENTION

1. Field of the Invention

The present invention relates to a method for manufacturing a bonded wafer by an ion implantation delamination method, and particularly to a method for manufacturing a bonded wafer by an ion implantation delamination method using a reclaimed wafer obtained by subjecting a delaminated wafer produced when a bonded wafer is formed by the ion implantation delamination method to a reclaiming process.

2. Description of the Related Art

A method of manufacturing a SOI wafer by delaminating ions-implanted wafers after bonding, i.e., an ion implantation delamination method (a technique also referred to as the Smart Cut method (registered trademark)), has attracted attention as a method of manufacturing silicon on insulator (SOI) wafers, particularly a method of manufacturing SOI wafers having a thin SOI layer that enable improvement in performance of advanced integrated circuits.

This ion implantation delamination method is a technique to form an SOI wafer (See Patent Literature 1) in the following manner: an oxide film is formed on at least one of two silicon wafers; gas ions such as hydrogen ions or rare gas ions are implanted from a front surface of one of the silicon wafers (a bond wafer) to form the ion implantation layer (also referred to as a micro bubble layer or an enclosed layer) in the interior of the wafer; the surface from which the ions are implanted is then brought into close contact with the other silicon wafer (a base wafer) through the oxide film; a heat treatment (a delamination heat treatment) is then performed to cleave one of the wafers (the bond wafer) along the micro bubble layer so that the bond wafer is separated into a thin film; and another heat treatment (a bonding heat treatment) is then performed to strengthen a bond between the wafers. At this point, the cleavage plane (the delamination surface) is a surface of an SOI layer, and an SOI wafer having a thin SOI with high uniformity is relatively easily obtained.

The ion implantation delamination method is not limited to the case where a bonded SOI wafer is manufactured by bonding two wafers thorough an insulator film, but also applied to the case where the wafer is manufactured by bonding the wafers directly.

In this ion implantation delamination method, a wafer can be repeatedly by subjecting again a bond wafer after delamination (a delaminated wafer) to a reclaiming process (refreshing process) including surface treatment such as polishing and etching to reduce or eliminate the influence of a step formed at an unbonded portion, surface roughness after delamination, and a remaining implantation layer. As to the reclaiming process, for example, there has been proposed a method of combining chamfer processing and polishing to remove the influence of an ion implantation layer remaining at a chamfer portion, as described in Patent Literature 2.

Regarding the reclaiming process performed on the delaminated wafer, a subject matter that a polishing stock removal of the delaminated wafer surface is 2 µm or more and the delaminated wafer is repeatedly used as the bond wafer, is described in Patent Literature 3. Moreover, in Patent Literature 4, a subject matter that the delaminated wafer can be repeatedly polished about 5 µm at most 10 times for repeatable use, is described. Further, in Patent Literature 5, a subject matter that a polishing stock removal of the delaminated wafer surface is 1 to 5 µm or more and the delaminated wafer is subjected to a reclaiming process many times, is described.

CITATION LIST

Patent Literature

Patent Literature 1: Japanese Unexamined Patent publication (Kokai) No. H05-211128
Patent Literature 2: Japanese Unexamined Patent publication (Kokai) No. 2001-155978
Patent Literature 3: Japanese Unexamined Patent publication (Kokai) No. 2008-21892
Patent Literature 4: Japanese Unexamined Patent publication (Kokai) No. 2006-140445
Patent Literature 5: Japanese Unexamined Patent publication (Kokai) No. 2007-149907

SUMMARY OP THE INVENTION

When film thickness distribution is measured on an SOI layer of a bonded SOI wafer manufactured by the ion implantation delamination method, unevenness of film thickness with a marble pattern is observed in some cases. The film thickness unevenness is also observed with the naked eye by appearance inspection of the surface of the SOI layer after delaminating the bond wafer. This film thickness unevenness forms a pattern in millimeters.

In recent years, the standard for film thickness distribution of the SOI layer is becoming severe and it is considered important to reduce film thickness unevenness with a large pattern caused during the delamination. Especially, it is desired to prevent the occurrence of film thickness unevenness in materials having an SOI layer with a film thickness of 30 nm or less, referred to as Extremely Thin SOI (ETSOI), since the film thickness unevenness significantly affects a product yield of these materials.

The present invention was accomplished in view of the above-described problems. It is an object of the present invention to inhibit the film thickness unevenness with a marble pattern formed in a thin film when a boned wafer is manufactured by the ion implantation delamination method and to manufacture a bonded wafer having a thin film with high thickness uniformity.

To achieve this object, the present invention provides a method for manufacturing a bonded wafer, comprising: implanting at least one gas ion selected from a hydrogen ion and a rare gas ion into a bond wafer from a surface of the bond wafer to form a ion implantation layer; bonding the surface from which the ion is implanted into the bond wafer and a surface of a base wafer directly or through an insulator film; and delaminating a part of the bond wafer along the ion implantation layer by a heat treatment to form a bonded wafer having a thin film on the base wafer, wherein the heat treatment is performed at 400° C. or lower to delaminate a part of the bond wafer along the ion implantation layer; the method further comprising measuring thicknesses of the bond wafer and the base wafer and selecting a combination of the bond wafer and the base wafer such that a difference between the thicknesses of both the wafers is 5 µm or more before bonding the bond wafer and the base wafer.

According to such a method for manufacturing a bonded wafer, the film thickness unevenness in the thin film can be inhibited and a bonded wafer having a thin film with high thickness uniformity can be manufactured.

The heat treatment is preferably performed at 350° C. or higher.

When the heat treatment is performed at 350° C. or higher, a part of the bond wafer can be surely delaminated along the ion implantation layer.

The bond wafer and/or the base wafer may be a reclaimed wafer obtained by subjecting a delaminated wafer produced when a bonded wafer is formed by the method for manufacturing the bonded wafer to a reclaiming process with reduction of a thickness of the delaminated wafer. The reclaimed wafer may be obtained by performing the reclaiming process with the reduction of thickness twice or more, or obtained by performing the reclaiming process to reduce the thickness by 5 μm or more.

The present invention can be suitably applied to the case that such a reclaimed wafer, which is particularly likely to cause the film thickness unevenness, is used, and thereby a bonded wafer having a thin film with high thickness uniformity can be manufactured with a reduced cost.

In addition, the bond wafer and the base wafer may be silicon single crystal wafers, the insulator film may be a silicon oxide film, and the thin film may be an SOI layer.

This enables manufacture of an SOI wafer having a thin SOI layer with high thickness uniformity.

According to the method for manufacturing a bonded wafer of the present invention, before bonding the bond wafer and the base wafer, thicknesses of the bond wafer and the base wafer are measured, a combination of the bond wafer and the base wafer is selected such that a difference between the thicknesses of both the wafers is 5 μm or more, and the heat treatment is performed at 400° C. or lower to delaminate a part of the bond wafer along the ion implantation layer. Thereby the film thickness unevenness in a thin film can be inhibited and a bonded wafer having a thin film with high thickness uniformity can be manufactured.

DETAILED DESCRIPTION OF THE PREFERRED EMBODIMENTS

Figure 1:
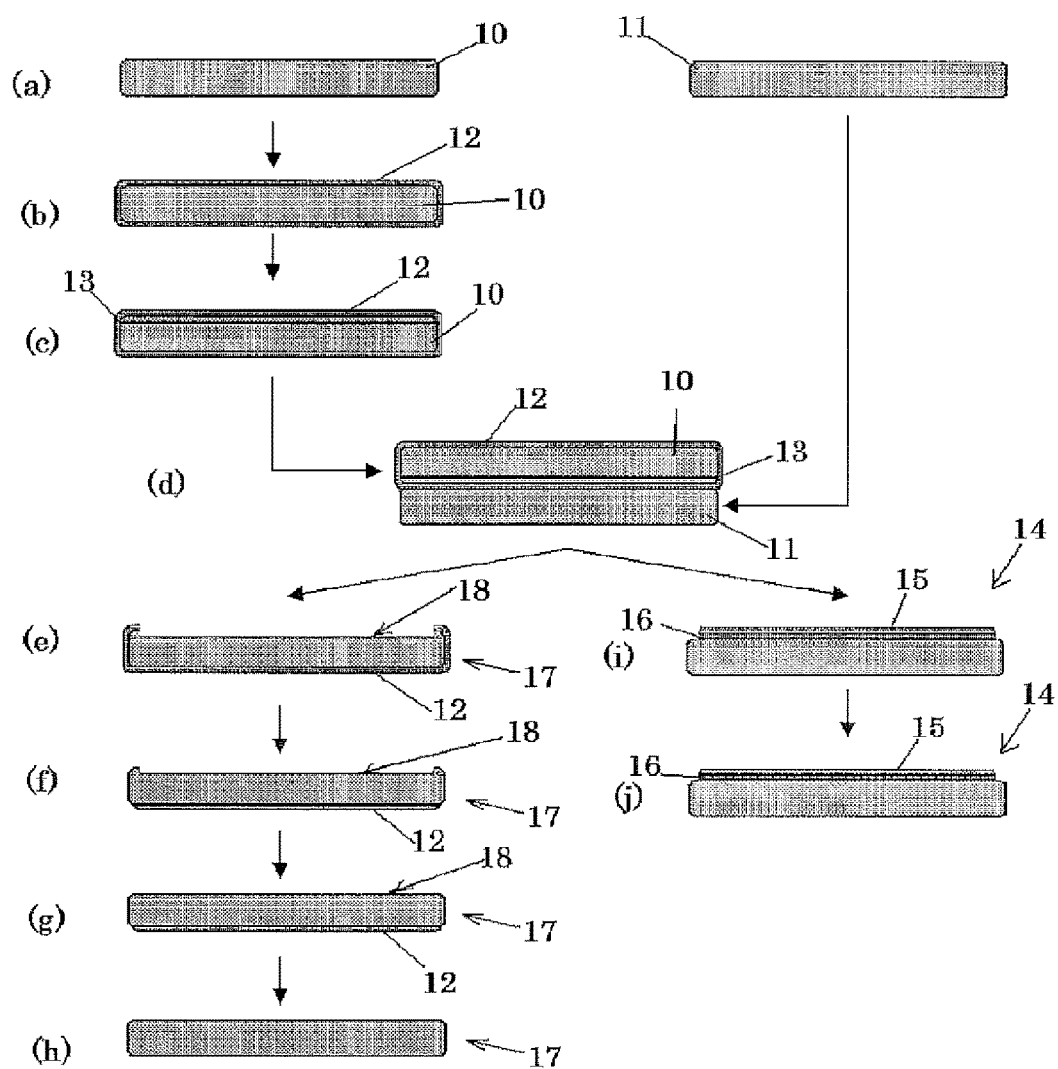
FIG. 1 is a flowchart showing an example of the method for manufacturing a bonded wafer of the present invention.

Hereinafter, embodiments of the present invention will be described, but the present invention is not limited thereto.

In general, when a bonded SOI wafer is manufactured by the ion implantation delamination method, a reclaimed wafer obtained by subjecting a delaminated wafer, which is a by-product of the bonded wafer, to a reclaiming process with the reduction in thickness is often used as the bond wafer or the base wafer, in order to reduce a cost. In other case, unused wafers (wafer not subjected to the reclaiming process, referred to as prime wafer, below) may be used as the bond wafer and the base wafer.

As described above, when a bonded SOI wafer is manufactured by the ion implantation delamination method, there is a problem that film thickness unevenness with a marble pattern is caused in an SOI layer of the bonded SOI wafer. The present inventors have investigated on this problem in detail, and revealed the following:

Use of prime wafers as the bond wafer and the base wafer frequently causes film thickness unevenness of the SOI layer when both the wafers are manufactured from different manufacturing lots; Use of a reclaimed wafer for at least one of the bond wafer and the base wafer causes the film thickness unevenness more frequently; The more times the wafer is reclaimed, the more frequently the unevenness is caused. Then, the present inventors conducted the following experiment using a prime wafer and a reclaimed wafer, and considered the tendency of increasing the frequency as follows.

Generally, silicon single crystal wafers used as the bond wafer and the base wafer are manufactured with a standard of wafer thickness of ±15 μm. In practice, wafers from the same manufacturing lot vary in thickness at most ±several μm. Accordingly, when prime wafers from the same manufacturing lot are used, the film thickness unevenness is hardly caused. In contrast, when wafers are obtained from different manufacturing lots which differ in median value of wafer thickness, difference between the thicknesses of the wafers may exceed 5 μm even if both the wafers are prime wafers, whereby the film thickness unevenness is frequently caused.

When the reclaimed wafer is used for at least one of the bond wafer and the base wafer, the possibility that difference between the wafer thicknesses exceeds 5 μm is high since the wafer is thinned due to the process for reducing the thickness. In particular, when a prime wafer is used for one of the bond wafer and the base wafer and a reclaimed wafer is used for the other, this possibility is extremely high. Accordingly, the film thickness unevenness is more frequently caused.

(Experimental Examples)

As the bond wafer and the base wafer, 4 types of mirror-polished wafers composed of a silicon single crystal with a crystal orientation of <100>, having a diameter of 300 mm and a thickness shown in Table 1 were prepared. The wafer thickness was measured over the entire wafer surface with a measurement apparatus of electrostatic capacity type, and the average value (rounded to integers) was calculated.

TABLE 1

| Symbol | Wafer type | Wafer thickness | Number of Reclaiming process |
|---|---|---|---|
| P(780) | Prime wafer | 780 μm | 0 |
| P(775) | Prime wafer | 775 μm | 0 |
| R(760) | Reclaimed wafer | 760 μm | 1 |
| R(740) | Reclaimed wafer | 740 μm | 2 |

These 4 types of wafers were used as the bond wafer and the base wafer to manufacture a bonded SOI wafer by the ion implantation delamination method under the following manufacture conditions. Thereafter, presence or absence of film thickness unevenness was evaluated by measuring the film thickness of the SOI layer (measurement apparatus: Acumap made by KLA-Tencor Corporation). The result is shown in Table 2.

The conditions for manufacturing a bonded SOI wafer are shown below.

[Bonded SOI Wafer Manufacturing Condition]
(Oxide film) A thermal oxide film of 55 nm thickness was formed on the bond wafer; the base wafer had no oxide film.
(Hydrogen ion-implantation condition) implantation energy: 48.7 keV, dose: $5 \times 10^{16}/cm^2$ (Delamination heat treatment) 350° C. for 4 hours and 500° C. for 30 minutes under an Ar atmosphere
(Flattening heat treatment) 1200° C. for 1 hour under an Ar atmosphere
(Adjustment of SOI film thickness) The thickness of the SOI layer was reduced to be about 70 nm by a sacrificial oxidation treatment.

TABLE 2

| Bond wafer | Base wafer | | | |
|---|---|---|---|---|
| | P(780) | P(775) | R(760) | R(740) |
| P(780) | ○ | x | x | x |
| P(775) | x | ○ | x | x |
| R(760) | x | x | ○ | x |
| R(740) | x | x | x | ○ |

From the result in Table 2, it was revealed that when the difference between the thicknesses of the bond wafer and the base wafer is 5 µm or more, film thickness unevenness was caused in the SOI layer. In Table 2, "o" means that the film thickness unevenness was not caused and "x" means that the film thickness unevenness was caused.

The mechanism of causing the film thickness unevenness due to the difference between the thicknesses of the bond wafer and the base wafer is not revealed yet, but it is supposed to be attributable to the variation in natural frequency of the delaminated region caused when the wafers having different thicknesses are separated by the delamination heat treatment.

On the other hand, when the same experiment was conducted under the above manufacture conditions except that the delamination heat treatment was performed at 400° C. for 8 hours, the film thickness unevenness of the SOI layer was not caused consequently in any combination shown in Table 2.

As described above, the present inventors have found that the film thickness unevenness is caused by a large difference between the thicknesses of the bond wafer and the base wafer, and the delamination heat treatment at 400° C. or lower enables the film thickness unevenness of the SOI layer to be inhibited even when the thickness difference is large, thereby bringing the present invention to completion.

Hereinafter, the method for manufacturing a bonded wafer of the present invention will be described with reference to FIG. 1.

In the present invention, a bonded wafer having a thin film on the base wafer, for example, an SOI wafer having an SOI layer formed on a silicon single crystal wafer through a silicon oxide film, can be manufactured.

First, as shown in FIG. 1 (a), a bond wafer 10 and a base wafer 11 are prepared. At this time, a combination of the bond wafer and the base wafer is selected from wafers the thickness of which is previously measured, such that the difference between the thicknesses of both the wafers is 5 µm or more. This selecting step is performed before bonding the bond wafer and the base wafer, and an order of the selecting step and other steps before the bonding step is not particularly limited. For example, the selecting step may be performed after a later-described step of forming an ion implantation layer into the bond wafer.

Both of the bond wafer and the base wafer may be prime wafers or reclaimed wafers. Alternatively, one of the bond wafer and the base wafer may be a prime wafer and the other may be a reclaimed wafer. The reclaimed wafer is a wafer obtained by subjecting a delaminated wafer produced when a bonded wafer is formed to the reclaiming process with the reduction in thickness, as mentioned above Use of the reclaimed wafer is preferable since the cost can be reduced. In particular, the method for manufacturing a bonded wafer of the present invention can inhibit film thickness unevenness of the thin film even when a reclaimed wafer which easily causes the film thickness unevenness of the thin film in the conventional manner is used, such as a reclaimed wafer obtained by performing the reclaiming process with the reduction in thickness twice or more (i.e., a reclaimed wafer that is reused twice or more) or a reclaimed wafer obtained by performing the reclaiming process to reduce the thickness by 5 µm or more.

Secondly, as shown in FIG. 1 (b), an oxide film 12, which will be a buried oxide film 16, is grown on the bond wafer 10, for example, by thermal oxidation or CVD. Alternatively, the oxide film 12 to be formed may be formed only in the base wafer 11 or in both the wafers. If a direct bonding wafer is produced, the formation of the oxide film is not necessarily needed.

Then, as shown in FIG. 1 (c), at least one type of gas ions selected from hydrogen ions and rare gas ions are implanted through the oxide film 12 with an ion implantation apparatus to form an ion implantation layer 13 in the interior of the bond wafer 10. At this time, an accelerating voltage of the ion implantation is selected such that a delaminated silicon (a thin film 15) having a target thickness can be obtained.

As shown in FIG. 1 (d), the implantation surface from which the ions are implanted into the bond wafer 10 is brought into close contact with a base wafer 11 and bonded.

The wafers thus bonded are then retained at 400° C. or lower for a predetermined time to form a micro bubble layer in the ion implantation layer 13, and subjected to heat treatment (delamination heat treatment) to perform the delamination along the micro bubble layer, thereby forming a bonded wafer 14 having the thin film 15 and the buried oxide film 16 formed on the base wafer 11, as shown in Table 1 (i).

As described above, the delamination heat treatment at 400° C. or lower enables inhibition of the thickness unevenness of the thin film 15 after delamination even when such a combination of the bond wafer 10 and the base wafer 11 that the deference between the thicknesses of both the wafers is 5 µm or more is selected, thereby enabling the bonded wafer 14 having the thin film 15 with high thickness uniformity to be manufactured.

Temperature of the delamination heat treatment is preferably 350° C. or higher.

When the delamination heat treatment is performed at 350° C. or higher, a part of the bond wafer 10 can be surely delaminated along the ion implantation layer 13. In addition, when the dose is constant, a time necessary for delamination tends to increase as the temperature of the delamination heat treatment is decreased. Therefore, the heat treatment time can be appropriately determined in consideration of the dose and the delamination heat treatment temperature.

A plasma treatment may be previously performed on surfaces to be bonded before bonding in order to enhance the bonding strength of the wafers that are brought into close contact at room temperature.

As shown in FIG. 1 (j), the bonded wafer 14 may be subjected to a flattening heat treatment, bonding heat treatment, polishing, etc., to flatten the delamination surface and enhance the bonding strength.

In the above manufacturing process, as shown in FIG. 1 (e), a delaminated wafer 17, which is the bond wafer 10 after delamination, is produced. The delaminated wafer 17 has a stepped portion, which is a portion not transferred to the base wafer 11, at outer circumference of the delamination surface 18. Such a delaminated wafer 17 can be subjected to a reclaiming process for removing the stepped portion and so on, and reused as a reclaimed wafer in the next manufacture of a bonded wafer. The reclaiming process of the delaminated wafer 17 can be performed, for example, as follows.

First, as shown in FIG. 1 (*f*), the oxide film is removed except for a part of the oxide film opposite to the delamination surface 18 by, for example, cleaning with a HF aqueous solution. The delamination surface is then polished to flatten the delamination surface and remove a layer damaged due to the ion implantation, as shown in FIG. 1 (*g*). Thereafter, as shown in FIG. 1 (*h*), the oxide film 12 of the back surface is removed by HF cleaning such as a conventional dip with a HF solution bath of batch type. In this way, a reclaimed wafer having front surface- and back surface-quality equal to a prime wafer can be produced. This reclaiming process makes the thickness of the reclaimed wafer thinner than that of the original bond wafer.

EXAMPLES

The present invention will be more specifically described below with reference to examples and comparative examples, but the present invention is not limited thereto.

Examples 1 and 2, Comparative Examples 1 to 3

Mirror-polished wafers composed of a silicon single crystal with a crystal orientation of <100>, having a diameter of 300 mm was used as the bond wafer and the base wafer, and a bonded SOI wafer was produced by the ion implantation delamination method. The wafer was then evaluated whether the SOI layer has thickness unevenness or not.

In any of examples 1 and 2 and comparative examples 1 to 3, a prime wafer (775 μm) was used as the base wafer and a reclaimed wafer (765 μm) obtained by performing a polishing process for reclaiming twice was used as the bond wafer.

The delamination heat treatment conditions are as shown in Table 3. The other manufacture conditions are the same as the experimental examples.

Figure 2:
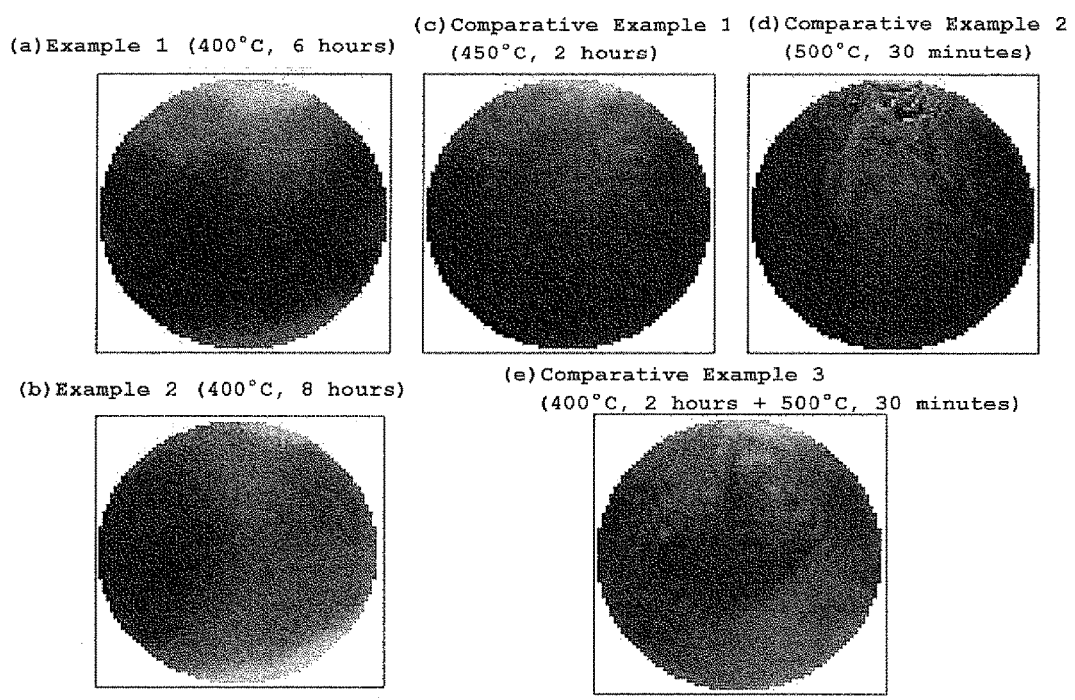
FIG. 2 is a film thickness map of an SOI wafer in examples 1 and 2, and comparative examples 1 to 3.

FIG. 2 shows results for the occurrence of thickness unevenness (film thickness map). FIG. 2 indicates that film thickness unevenness was not caused in examples 1 and 2 in which the delamination heat treatment was performed at 400° C., while film thickness unevenness was caused in comparative examples 1 to 3. In comparative example 3, heat treatment was performed at 500° C. after pre-annealing at 400° C., but the delamination did not take place at the pre-annealing. The thickness unevenness is supposed to be caused because of delamination during the heat treatment at 500° C. in comparative example 3.

Table 3 shows an SOI film thickness range (a value obtained by subtracting a minimum value of in-plane film thickness from a maximum value thereof). In examples 1 and 2 in which the thickness unevenness was not caused, the SOI film thickness range was a good value of about 1.5 to 1.6 nm; meanwhile in comparative example 1 to 3, the range was about 2.0 to 2.2 nm.

TABLE 3

| | Delamination heat treatment conditions | In place film thickness range (nm) |
| --- | --- | --- |
| Example 1 | 400° C., 6 hours | 1.6 |
| Example 2 | 400° C., 8 hours | 1.5 |
| Comparative Example 1 | 450° C., 2 hours | 2.1 |
| Comparative Example 2 | 500° C., 30 minutes | 2.2 |
| Comparative Example 3 | 400° C., 2 hours + 500° C., 30 minutes | 2.0 |

Examples 3 and 4

A bonded SOI wafer was manufactured under the same conditions as examples 1 and 2, except that the delamination heat treatment was performed at 380° C. for 12 hours (example 3) or at 350° C. for 24 hours (example 4), and evaluated whether the SOI layer has thickness unevenness or not. As a result, the film thickness unevenness was not caused and the SOI film thickness range was equivalent to examples 1 and 2.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

For example, in the foregoing, the case where a bonded SOI wafer is manufactured though an insulator film is described, but the present invention can also be applied to the case where a bonded wafer is manufactured by bonding two wafers directly.

The invention claimed is:

1. A method for manufacturing a bonded wafer, comprising:
   implanting at least one gas ion selected from a hydrogen ion and a rare gas ion into a bond wafer from a surface of the bond wafer to form an ion implantation layer;
   bonding the surface from which the ion is implanted into the bond wafer and a surface of a base wafer directly or through an insulator film; and
   delaminating a part of the bond wafer along the ion implantation layer by a heat treatment to form a bonded wafer having a thin film on the base wafer, wherein the heat treatment is performed at from 350° C. to 400° C. to delaminate a part of the bond wafer along the ion implantation layer;
   the method further comprising measuring thicknesses of the bond wafer and the base wafer and selecting a combination of the bond wafer and the base wafer such that a difference between the thicknesses of both the wafers is from 5 μm to 40 μm before bonding the bond wafer and the base wafer.

2. The method for manufacturing a bonded wafer according to claim 1, wherein the bond wafer and/or the base wafer is a reclaimed wafer obtained by subjecting a delaminated wafer produced when a bonded wafer is formed by the method for manufacturing the bonded wafer to a reclaiming process with reduction of a thickness of the delaminated wafer.

3. The method for manufacturing a bonded wafer according to claim 2, wherein the reclaimed wafer is obtained by performing the reclaiming process with reduction of the thickness twice or more.

4. The method for manufacturing a bonded wafer according to claim 3, wherein the reclaimed wafer is obtained by performing the reclaiming process to reduce the thickness by 5 μm or more.

5. The method for manufacturing a bonded wafer according to claim 4, wherein the bond wafer and the base wafer are silicon single crystal wafers, the insulator film is a silicon oxide film, and the thin film is an SOI layer.

6. The method for manufacturing a bonded wafer according to claim 3, wherein the bond wafer and the base wafer are silicon single crystal wafers, the insulator film is a silicon oxide film, and the thin film is an SOI layer.

7. The method for manufacturing a bonded wafer according to claim 2, wherein the reclaimed wafer is obtained by performing the reclaiming process to reduce the thickness by 5 μm or more.

8. The method for manufacturing a bonded wafer according to claim 7, wherein the bond wafer and the base wafer are silicon single crystal wafers, the insulator film is a silicon oxide film, and the thin film is an SOI layer.

9. The method for manufacturing a bonded wafer according to claim 2, wherein the bond wafer and the base wafer are silicon single crystal wafers, the insulator film is a silicon oxide film, and the thin film is an SOI layer.

10. The method for manufacturing a bonded wafer according to claim 1, wherein the bond wafer and the base wafer are silicon single crystal wafers, the insulator film is a silicon oxide film, and the thin film is an SOI layer.

* * * * *